United States Patent
Chen et al.

(10) Patent No.: US 7,385,294 B2
(45) Date of Patent: Jun. 10, 2008

(54) SEMICONDUCTOR DEVICE HAVING NICKEL SILICIDE AND METHOD OF FABRICATING NICKEL SILICIDE

(75) Inventors: Yi-Wei Chen, Tai-Chung Hsien (TW); Chao-Ching Hsieh, Hsin-Chu Hsien (TW); Yi-Yiing Chiang, Taipei (TW); Tzung-Yu Hung, Tainan Hsien (TW); Yu-Lan Chang, Kao-Hsiung (TW); Po-Chao Tsao, Taipei Hsien (TW); Chang-Chi Huang, Miao-Li Hsien (TW); Ming-Tsung Chen, Hsin-Chu Hsien (RW)

(73) Assignee: United Microelectronics Corp., Hsin-Chu (TW)

( * ) Notice: Subject to any disclaimer, the term of this patent is extended or adjusted under 35 U.S.C. 154(b) by 70 days.

(21) Appl. No.: 11/162,360

(22) Filed: Sep. 8, 2005

(65) Prior Publication Data

US 2007/0054481 A1 Mar. 8, 2007

(51) Int. Cl.
*H01L 23/48* (2006.01)
(52) U.S. Cl. ............... 257/766; 257/382; 257/764; 257/751; 257/E21.165
(58) Field of Classification Search ........ 257/382–384, 257/751, 766–770
See application file for complete search history.

(56) References Cited

U.S. PATENT DOCUMENTS

2005/0208762 A1* 9/2005 Chen et al. ................. 438/649
2006/0205214 A1* 9/2006 Shih et al. .................. 438/682
2007/0018255 A1* 1/2007 Kawamura ................. 257/382

FOREIGN PATENT DOCUMENTS

CN         1633703 A     6/2005
WO     WO02/047145      6/2002

* cited by examiner

*Primary Examiner*—Dung A. Le
(74) *Attorney, Agent, or Firm*—Winston Hsu

(57) ABSTRACT

A semiconductor device having nickel silicide and a method for fabricating nickel silicide. A semiconductor substrate having a plurality of doped regions is provided. Subsequently, a nickel layer is formed on the semiconductor substrate, and a first rapid thermal process (RTP) is performed to react the nickel layer with the doped regions disposed thereunder. Thereafter, the unreacted nickel layer is removed, and a second rapid thermal process is performed to form a semiconductor device having nickel silicide. The second rapid thermal process is a spike anneal process whose process temperature is between 400 and 600° C.

7 Claims, 15 Drawing Sheets

SEMICONDUCTOR DEVICE HAVING NICKEL SILICIDE AND METHOD OF FABRICATING NICKEL SILICIDE

BACKGROUND OF THE INVENTION

1. Field of the Invention

The present invention pertains to a semiconductor device having nickel silicide and a method of fabricating nickel silicide. The semiconductor device has nickel silicides including nickel monosilicide and nickel disilicide on the surface of source/drain regions, and the nickel silicides are formed by two rapid thermal processes.

2. Description of the Prior Art

Silicide has been widely applied to IC fabrications for its advantages, such as high melt point, low resistance, etc. Currently, while critical dimension, contact area, and junction depth are diminished gradually, the gate and source/drain regions of most semiconductor devices require silicide to reduce gate resistance, contact resistance, and RC delay, so as to improve drive current.

Silicide is fabricated by first forming a metal thin film on a semiconductor substrate, and subsequently performing a thermal process. Generally, the metal thin film is formed by, for instance evaporating or sputtering, on the semiconductor substrate covering where to form silicide such as gate, and source/drain regions. Thereafter, the semiconductor substrate is heated so that the metal thin film reacts with the gate and source/drain regions.

Silicide has another advantage of self-alignment. Currently, self-aligned silicide (also referred to as salicide) has been broadly applied in IC fabrications. Please refer to FIG. 1 through FIG. 4. FIG. 1 through FIG. 4 are schematic diagrams illustrating a conventional method for fabricating silicide. As shown in FIG. 1, a semiconductor substrate 10 is provided. The semiconductor substrate 10 includes isolations 12 (e.g. field oxide or STI), a gate dielectric layer 14, a polycrystalline silicon gate 16 disposed on the gate dielectric layer 14, a spacer structure 18 formed alongside the polycrystalline silicon gate 16, and source/drain regions 20 disposed in the semiconductor substrate 10 between the polycrystalline silicon gate 16 and the isolations 12.

As shown in FIG. 2, a physical vapor process is performed to deposit a metal thin film 22 on the semiconductor substrate 10 covering the polycrystalline silicon gate 16 and the source/drain regions 20. As shown in FIG. 3, an anneal process is performed to react the metal thin film 22 with the polycrystalline silicon gate 16 and the source/drain regions 20, so as to form silicides 24 on the polycrystalline silicon gate 16 and the source/drain regions 20. As shown in FIG. 4, the unreacted metal thin film 22 is removed.

Normally, metal materials for fabricating silicide are titanium, cobalt, nickel, etc. Titanium disilicide ($TiSi_2$) has a lower resistance ranging between 12 and 20 $\mu\Omega$-cm, however, it suffers from narrow linewidth effect. When critical dimension reduces to less than 180 nm, the sheet resistance increases dramatically. Therefore, cobalt disilicide ($CoSi_2$) and nickel monosilicide (NiSi) whose resistances are slightly higher (15 to 20 $\mu\Omega$-cm) are more suitable for forming silicide because nearly no narrow linewidth effect is observed. Between these two materials, nickel consumes less silicon in the silicidation process, and thus is more preferred.

Nickel silicide, however, still suffers some disadvantages. Please refer to FIG. 5 and FIG. 6. FIG. 5 and FIG. 6 are schematic diagrams respectively illustrating a semiconductor device having nickel silicide formed by a conventional method. As shown in FIG. 5, the semiconductor device includes a semiconductor substrate 30, isolations 32, a gate dielectric layer 34 disposed on the semiconductor substrate 30, a polycrystalline silicon gate 36 disposed on the gate dielectric layer 34, a spacer structure 38 formed alongside the polycrystalline silicon gate 36, and source/drain regions 40 positioned in the semiconductor substrate 30 between the polycrystalline silicon gate 36 and the isolations 32. Nickel silicides 42 are formed on the surface of the source/drain regions 40. However, the nickel silicides 42 of the semiconductor device (especially an P type device) tend to grow downward as shown in FIG. 5. This phenomenon is referred to as spiking effect, and leads to current leakage between the source/drain regions 40 and the semiconductor substrate 30. In addition to the spiking effect, the nickel silicides 42 of the semiconductor device (especially a N type device) tend to grow laterally as shown in FIG. 6. This phenomenon is referred to as piping effect, and results to reduction of threshold voltage.

In view of the aforementioned problems, the present invention proposes a semiconductor device having nickel silicide and a method for fabricating nickel silicide to avoid these problems. The nickel silicide of the present invention includes nickel monosilicide and nickel disilicide formed by two rapid thermal processes. Consequently, spiking defect and piping defect are prevented.

SUMMARY OF THE INVENTION

It is one object of the claimed invention to provide a semiconductor device having nickel silicide and a method for fabricating nickel silicide to avoid the aforementioned problems.

According to the claimed invention, a method of fabricating nickel silicide is proposed. First, a semiconductor substrate having a plurality of doped regions is provided. A nickel layer is formed on the semiconductor substrate, and a first rapid thermal process is performed to react the nickel layer with the doped regions disposed thereunder. Subsequently, the unreacted nickel layer is removed, and a second rapid thermal process is performed. The second rapid thermal process is a spike anneal process having a process temperature between 400 and 600° C.

According to the claimed invention, a semiconductor device having nickel silicide is also disclosed. The semiconductor device has a semiconductor substrate; a plurality of doped regions disposed in the semiconductor substrate; and a plurality of nickel silicides disposed in the doped regions. Each nickel silicide has a nickel monosilicide region including nickel monosilicide disposed on a surface of each doped region, and a nickel disilicide pocket including nickel disilicide disposed on an interface between each nickel monosilicide region and each doped region.

According to the claimed invention, another semiconductor device having nickel silicide is still disclosed. The semiconductor device has a semiconductor substrate; a plurality of doped regions disposed in the semiconductor substrate; and a plurality of nickel silicides disposed in the doped regions. Each nickel silicide includes nickel monosilicide and nickel disilicide, and nickel disilicide has a weight percentage of between 1% and 10%.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
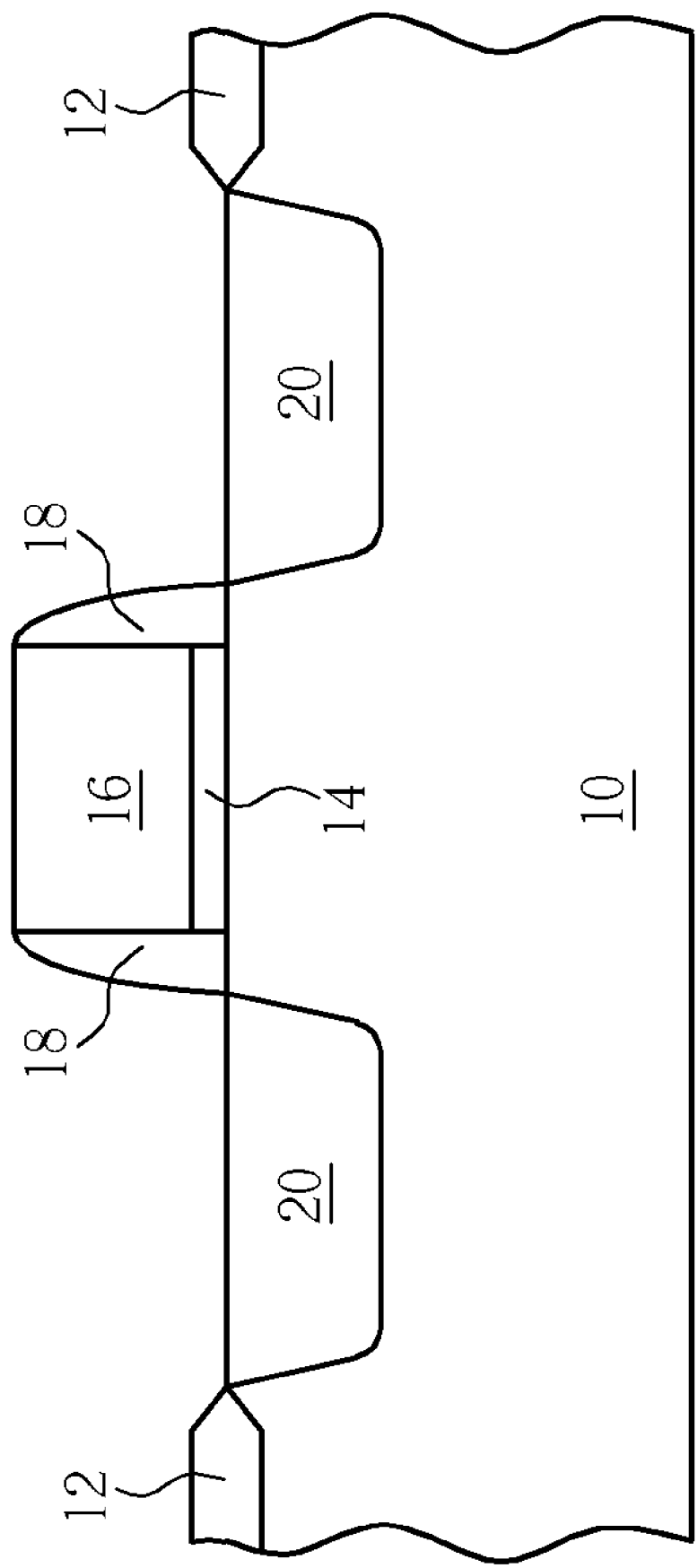
FIG. 1 through FIG. 4 are schematic diagrams illustrating a method for fabricating silicide.
Figure 2:
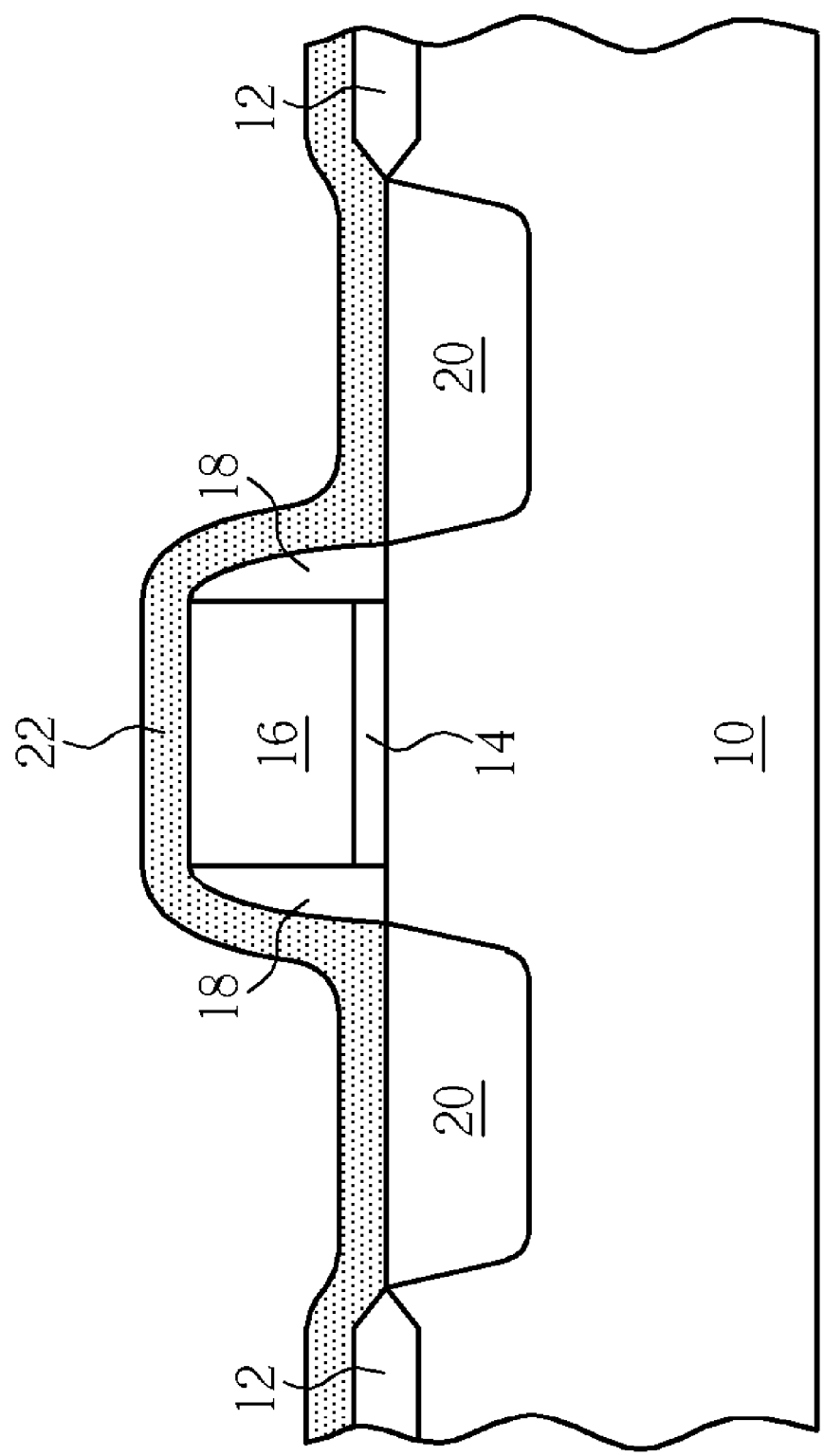
Figure 3:
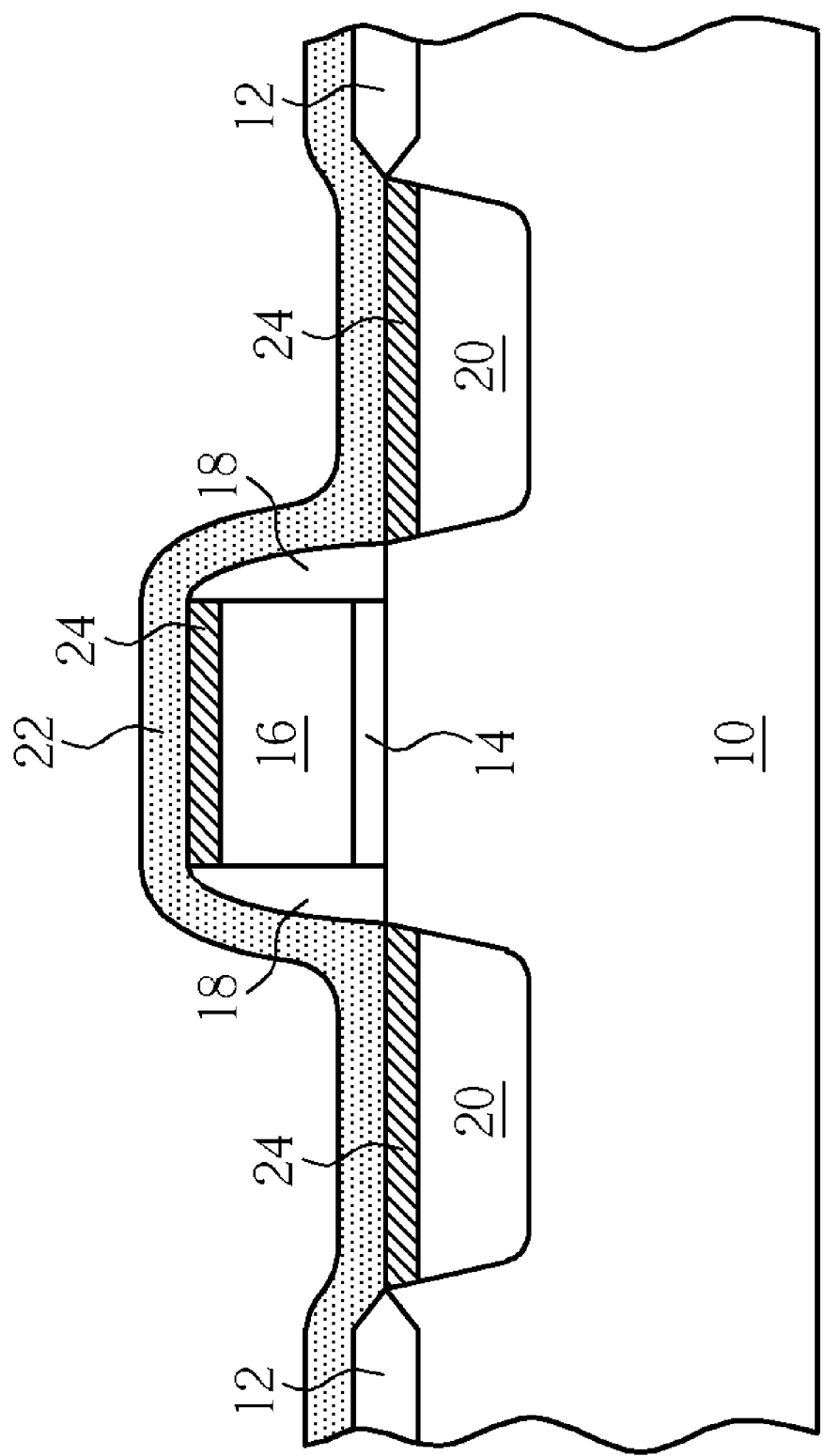
Figure 4:
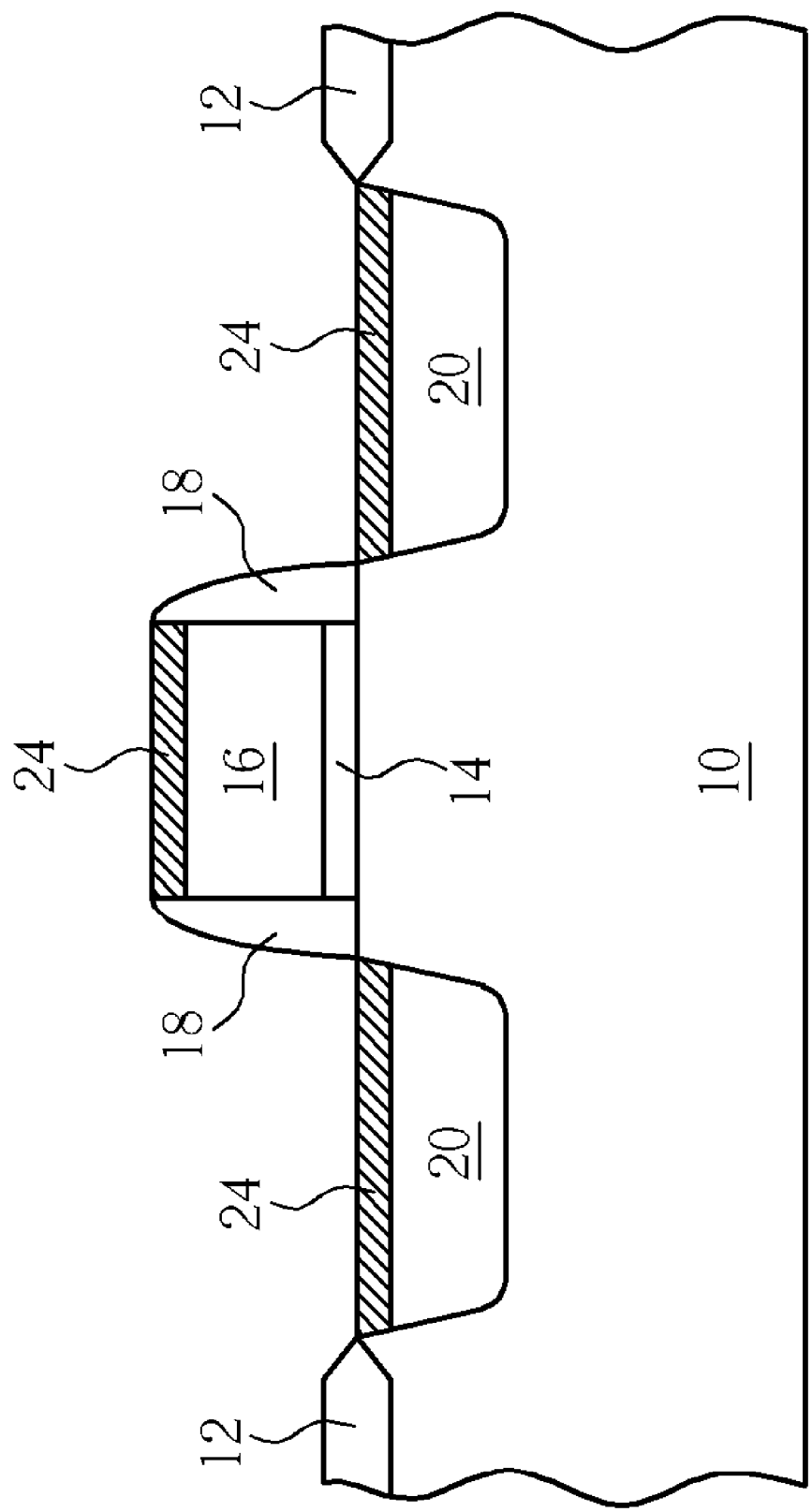
Figure 5:
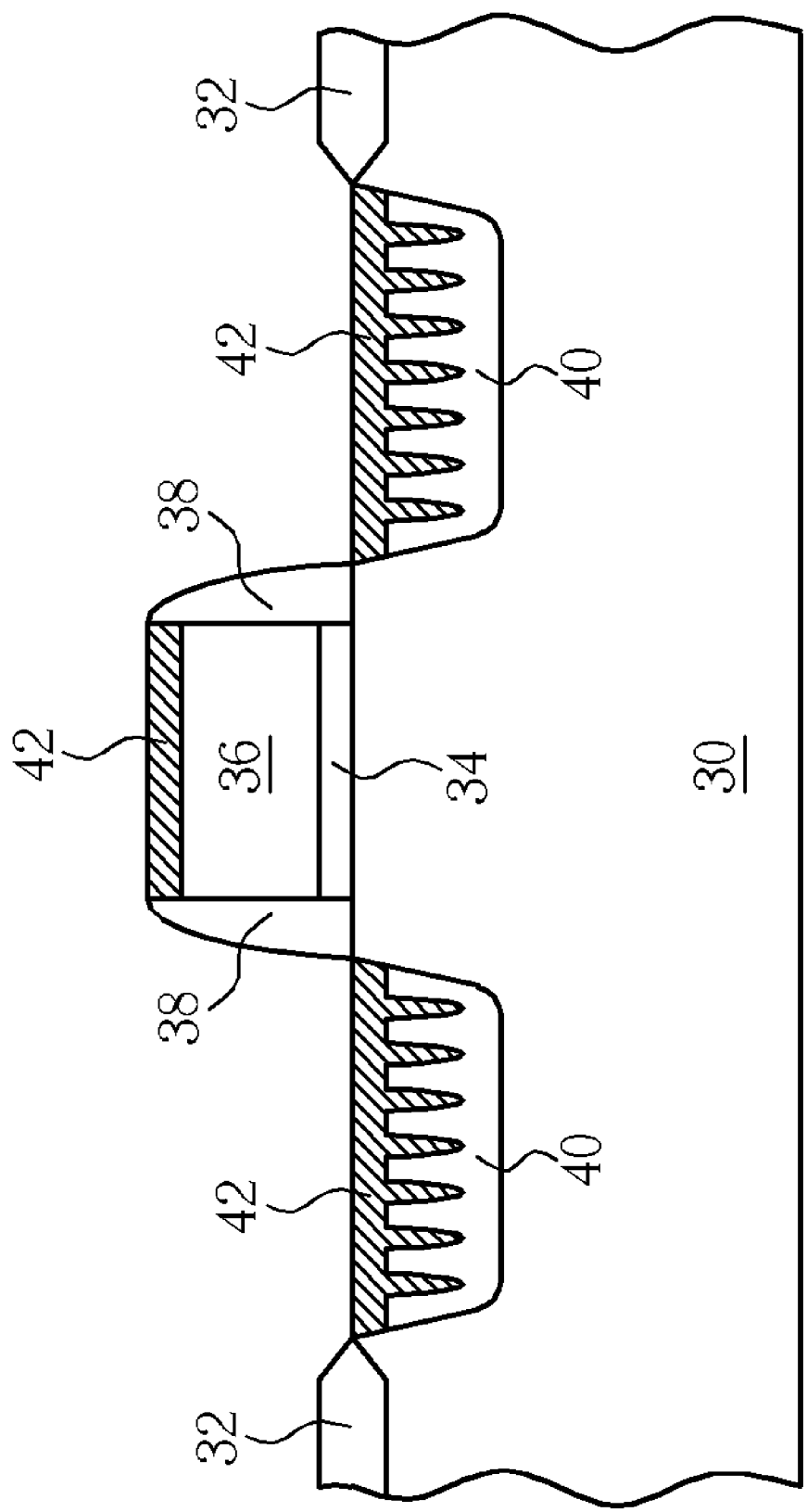
FIG. 5 and FIG. 6 are schematic diagrams respectively illustrating a semiconductor device having nickel silicide formed by a conventional method.
Figure 6:
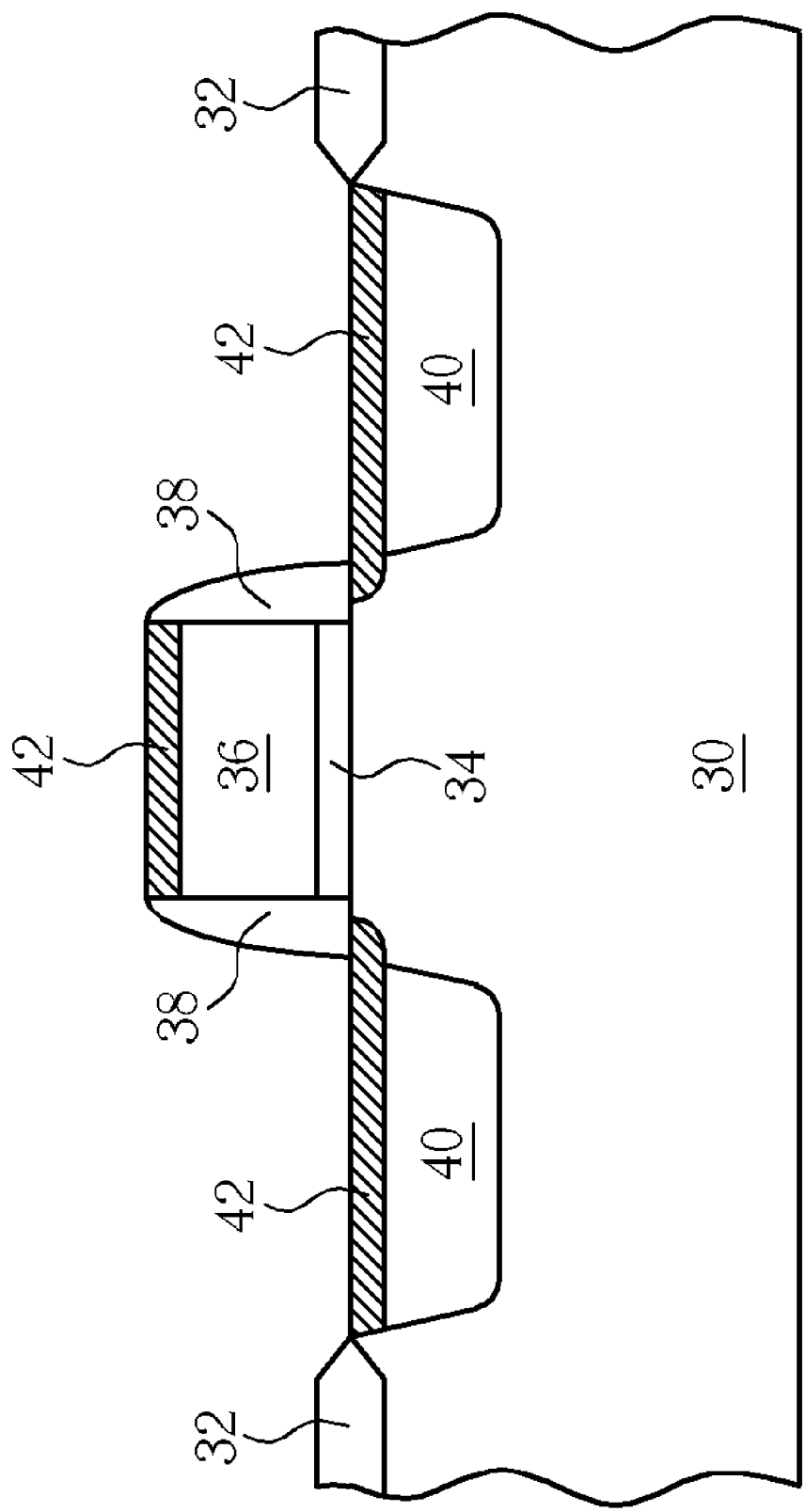
Figure 7:
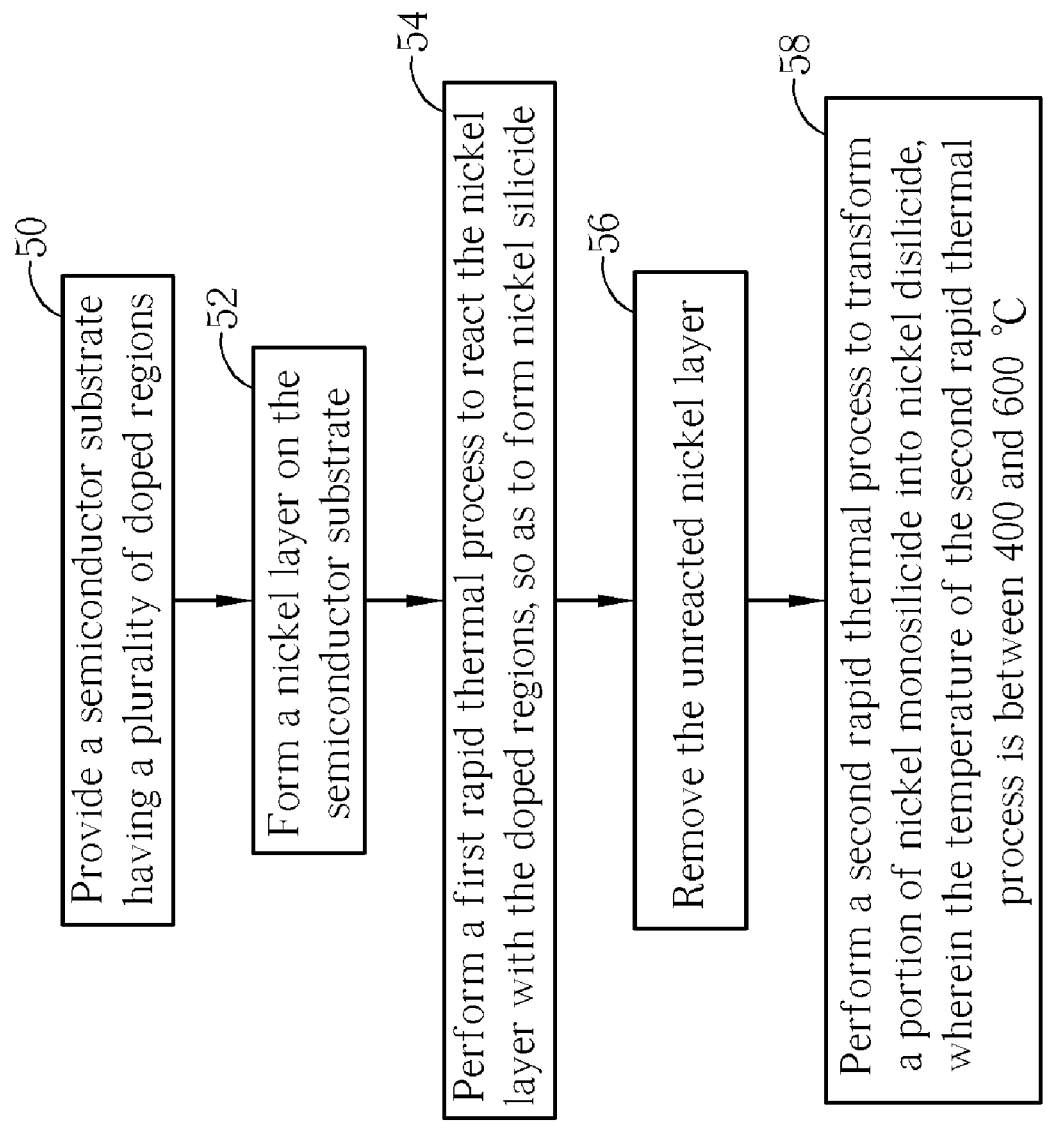
FIG. 7 is a flow chart illustrating the process steps of forming nickel silicide according to a preferred embodiment of the present invention.

Please refer to FIG. 7, which is a flow chart illustrating the process steps of forming nickel silicide according to a preferred embodiment of the present invention. As shown in FIG. 7, the method of the present invention includes the following steps:

Step 50: providing a semiconductor substrate having a plurality of doped regions;

Step 52: forming a nickel layer on the semiconductor substrate;

Step 54: performing a first rapid thermal process to react the nickel layer with the doped regions, so as to form nickel silicide;

Step 56: removing the unreacted nickel layer; and

Step 58: performing a second rapid thermal process to transform a portion of nickel monosilicide into nickel disilicide, wherein the temperature of the second rapid thermal process is between 400 and 600° C.

The method for fabricating nickel silicide features a two-step rapid thermal process. Specifically, a first rapid thermal process is performed after the nickel layer is formed on the semiconductor substrate to form nickel monosilicide. Subsequently, the unreacted nickel layer is removed, and a second rapid thermal process is carried out to transform a portion of nickel monosilicide into nickel disilicide.

Nickel monosilicide has a lower resistance ranging between 15 and 20 µΩ-cm, but is less thermal stable. On the other hand, nickel disilicide has a relatively higher resistance ranging between 40 and 50 µΩ-cm, but is thermally stable. Accordingly, the method of the present invention transforms a small portion of nickel monosilicide into nickel disilicide so as to prevent nickel monosilicide from growing downward or laterally in the doped regions. Consequently, spiking defect and piping defect are diminished. It is appreciated that the weight percentage of nickel disilicide is merely between 1% and 10%, and thus the resistance of nickel silicide nearly remains the same.

Figure 8:
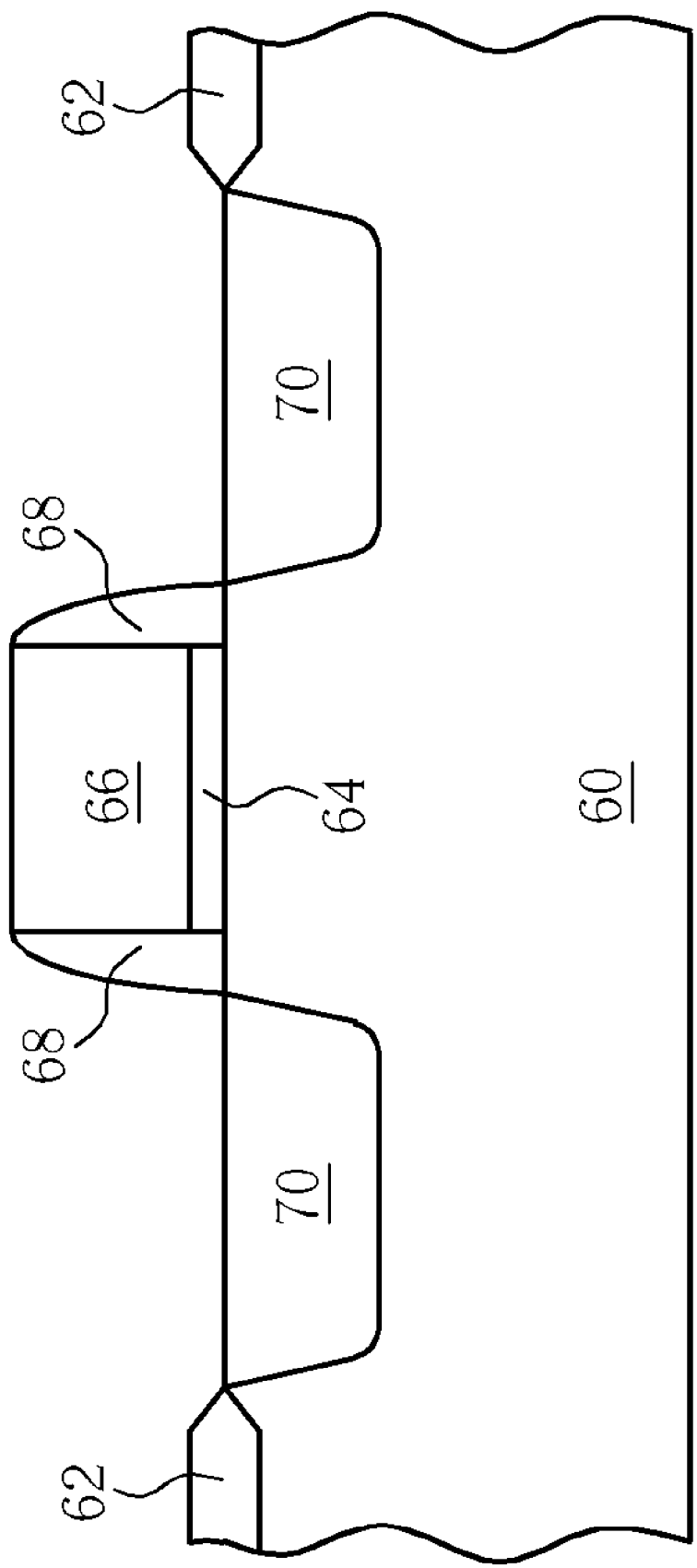
FIG. 8 through FIG. 11 schematically illustrate a method for fabricating nickel silicide according to a preferred embodiment of the present invention.

Please keep on referring to FIG. 8 through FIG. 11. FIG. 8 through FIG. 11 schematically illustrate a method for fabricating nickel silicide according to a preferred embodiment of the present invention, in which only one semiconductor device is schematically drawn. As shown in FIG. 8, a semiconductor substrate 60 is provided. The semiconductor substrate 60 can be a silicon substrate, an SOI substrate, or other suitable substrates. The semiconductor substrate 60 includes isolations 62 e.g. FOX or STI, a gate dielectric layer 64 e.g. a gate oxide layer, a gate 66 e.g. a polycrystalline silicon gate disposed on the gate dielectric layer 64, a spacer structure 68 formed alongside the gate 66, and source/drain regions 70 disposed in the semiconductor substrate 60 between the gate 66 and the insulators 62. In this embodiment, the semiconductor device can be various transistors, memory devices, logic devices, etc.

Figure 9:
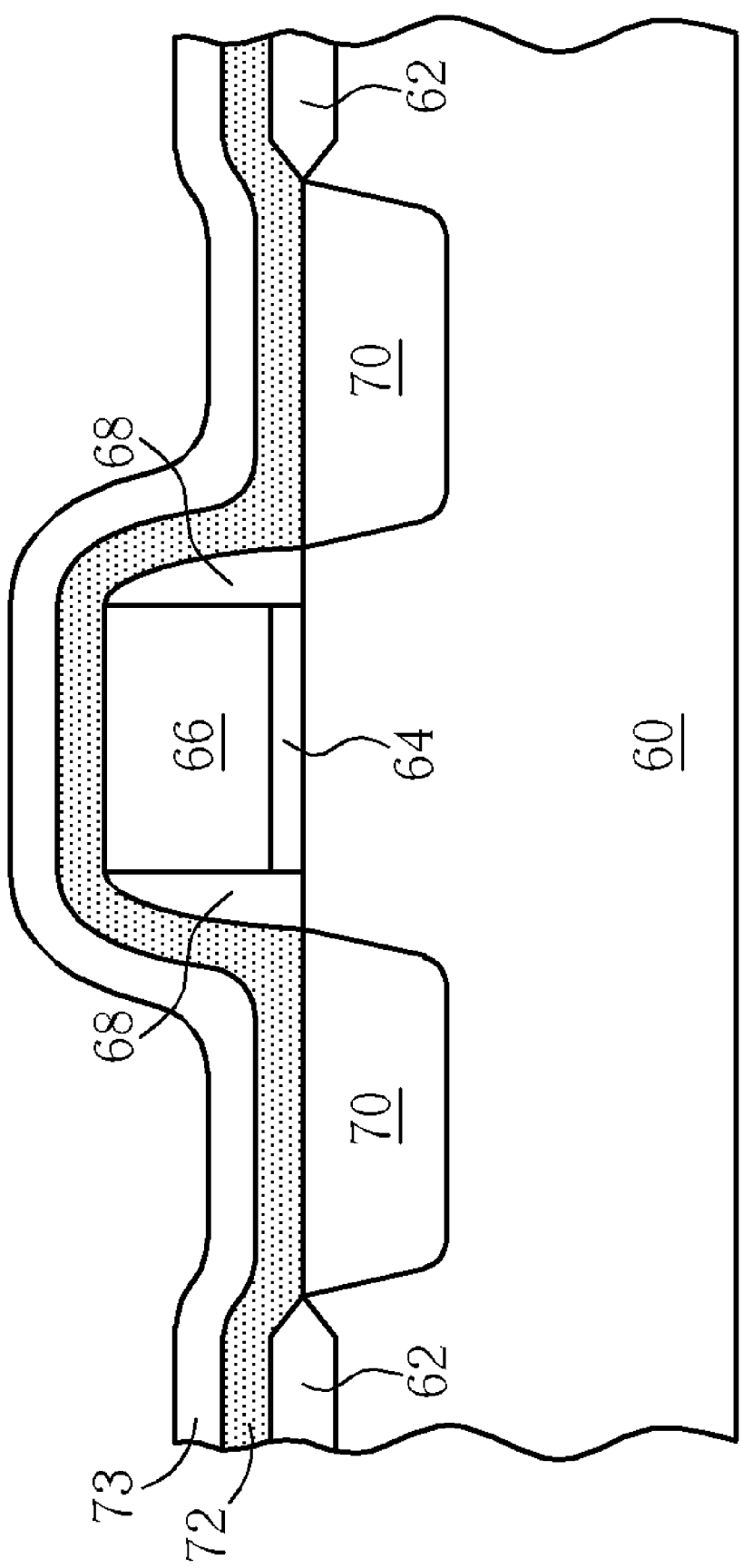
Figure 10:
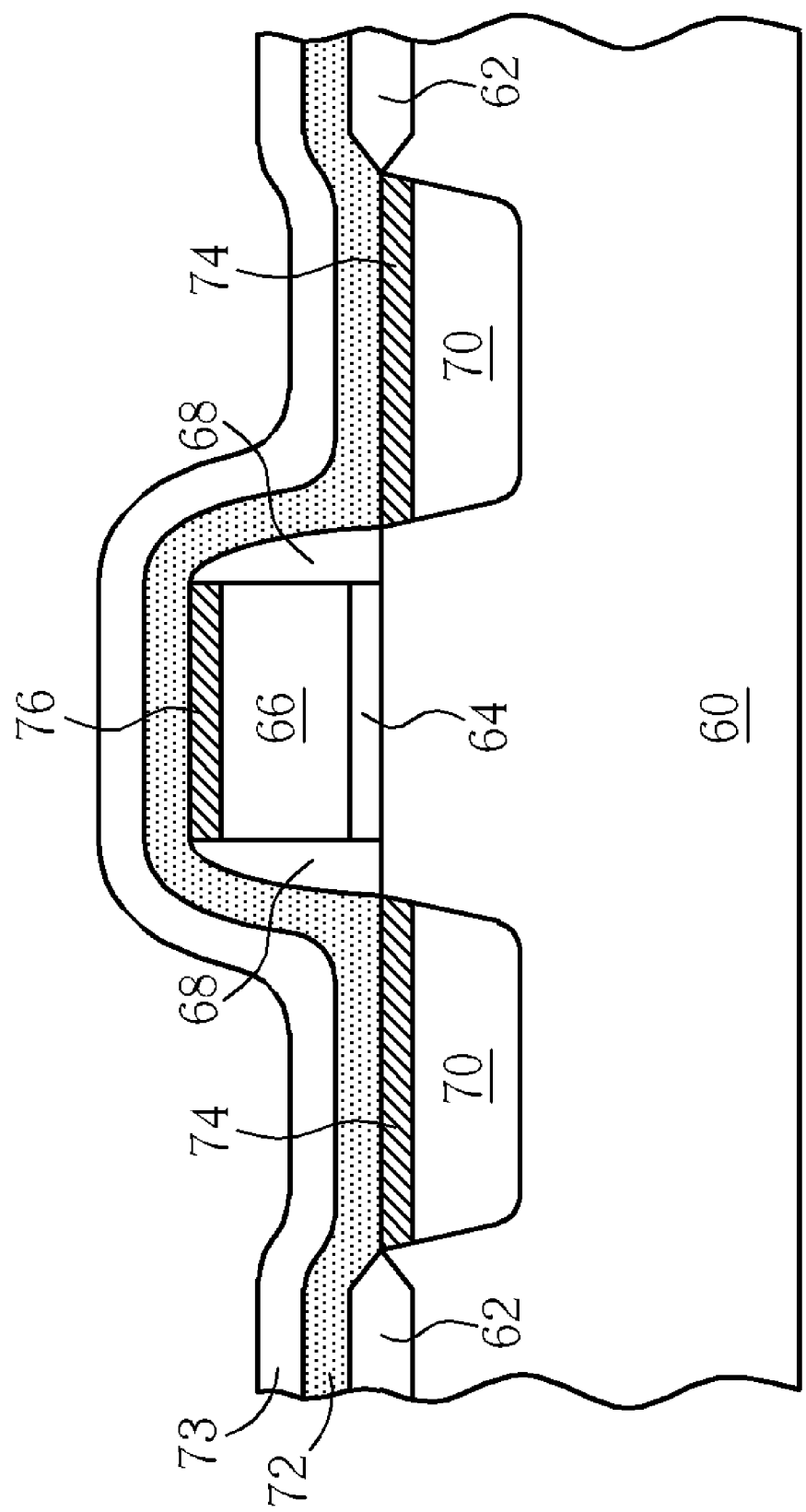

As shown in FIG. 9, a physical vapor deposition process, such as an evaporating process or a sputtering process, is performed to deposit a nickel layer 72 on the semiconductor substrate 60 to cover the gate 66 and the source/drain regions 70. The nickel layer 72 can be a nickel metal layer or a nickel alloy layer. After the nickel layer 72 is deposited, a barrier layer 73 e.g. a titanium layer or a titanium oxide layer is optionally formed on the nickel layer 72 to prevent oxidization of the nickel layer 72. As shown in FIG. 10, a first rapid thermal process is performed to react the nickel layer 72 with the gate 66 and the source/drain regions 70. Therefore, nickel monosilicide regions 74 substantially consist of nickel monosilicide are formed on the surface of the source/drain regions 70, and nickel silicide 76 is formed on the gate 66. Since the nickel layer 72 is only in contact with the gate 66 and the source/drain regions 70, the method of the present invention is self-aligned. It is appreciated that the first rapid thermal process can be a soak anneal process or a spike anneal process, and the process temperature is between 250 to 350° C. Preferably, the process temperature is 300° C.

Figure 11:
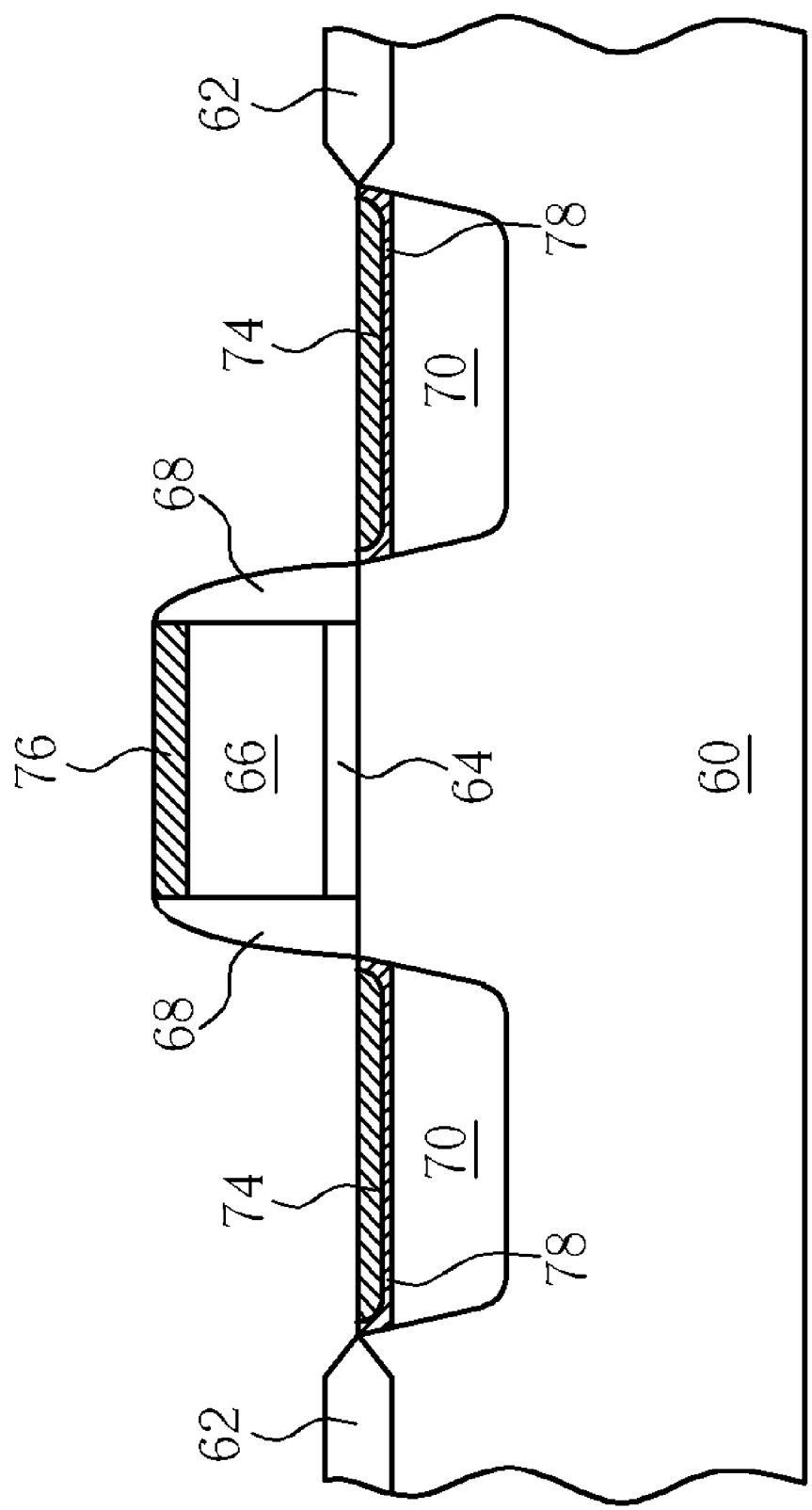

As shown in FIG. 11, the barrier layer 73 and the unreacted nickel layer 72 are removed. A second rapid thermal process is subsequently performed to transform nickel monosilicide positioned at the bottom of the nickel monosilicide regions 74 into nickel disilicide, so as to form a nickel disilicide pocket 78 under each nickel monosilicide region 74. In this embodiment, the second rapid thermal process is a spike anneal process. The process temperature is between 400 and 600° C., and preferably between 480 and 520° C. The process time is between 5 and 20 seconds, and preferably between 8 and 12 seconds. It is noted that the temperature time of the spike anneal process is measured by "T-50". "T-50" means the time duration between the two temperature points 50 degrees lower than the highest temperature (T° C.). In addition, after the first rapid thermal process, another form of nickel silicide, dinickel silicide ($Ni_2Si$), which has a high resistance, may produce. The second rapid thermal process also works to transform dinickel silicide into nickel monosilicide.

Accordingly, semiconductor device having nickel silicide is formed. The nickel silicide of the present invention includes nickel monosilicide region substantially consist of nickel monosilicide and nickel disilicide pockets consist of nickel disilicide. In addition, the weight percentage of nickel disilicide is between 1% and 10%. Consequently, the resistance of nickel silicide is not affected, while spiking defect and piping defect are diminished.

Figure 12:
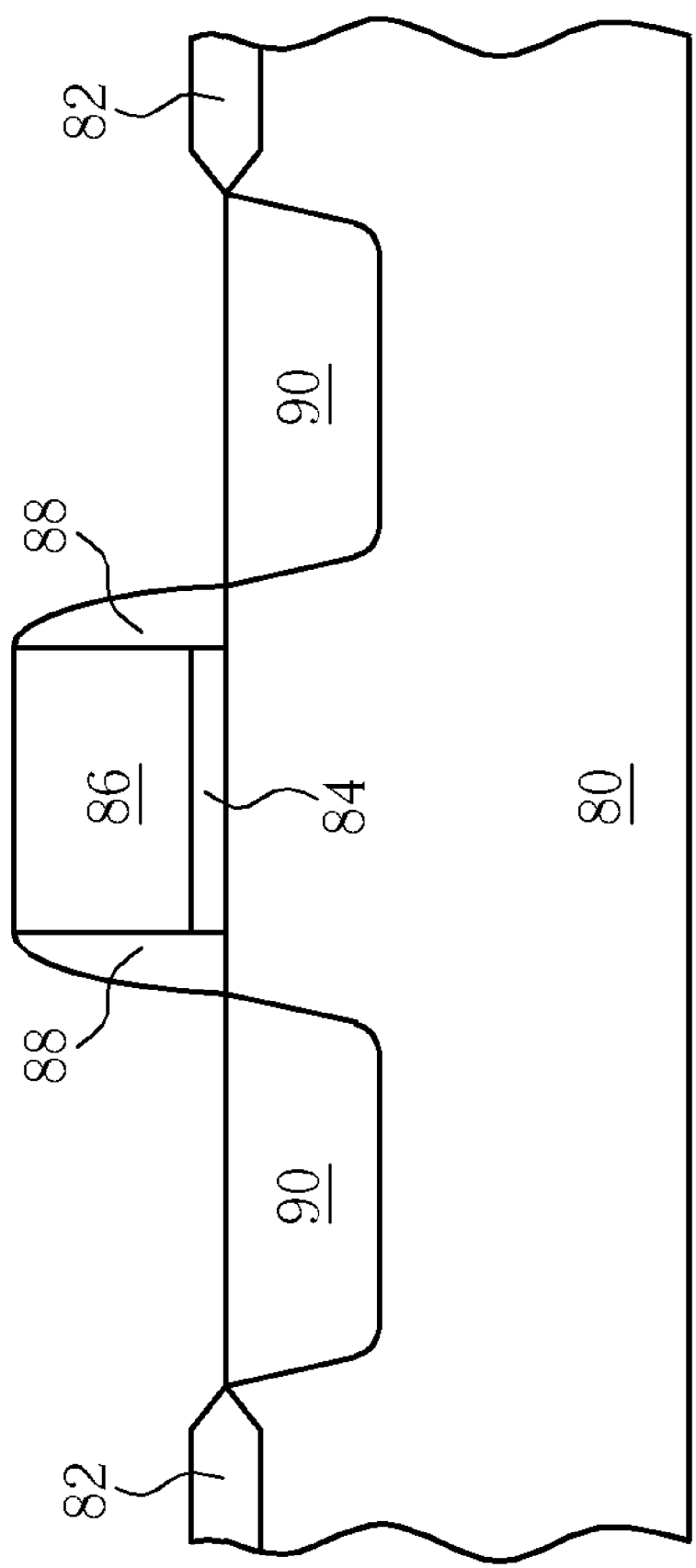
FIG. 12 through FIG. 15 schematically illustrate a method for fabricating nickel silicide according to another preferred embodiment of the present invention.

Please refer to FIG. 12 through FIG. 15. FIG. 12 through FIG. 15 schematically illustrate a method for fabricating nickel silicide according to another preferred embodiment of the present invention, in which only one semiconductor device is schematically drawn. As shown in FIG. 12, a semiconductor substrate 80 is provided. The semiconductor substrate 80 includes isolations 82, a gate dielectric layer 84, a gate 86 e.g. a polycrystalline silicon gate disposed on the gate dielectric layer 84, a spacer structure 88 formed alongside the gate 86, and source/drain regions 90 disposed in the semiconductor substrate 80 between the gate 86 and the insulator 82. In this embodiment, the semiconductor device can be various transistors, memory devices, logic devices, etc.

Figure 13:
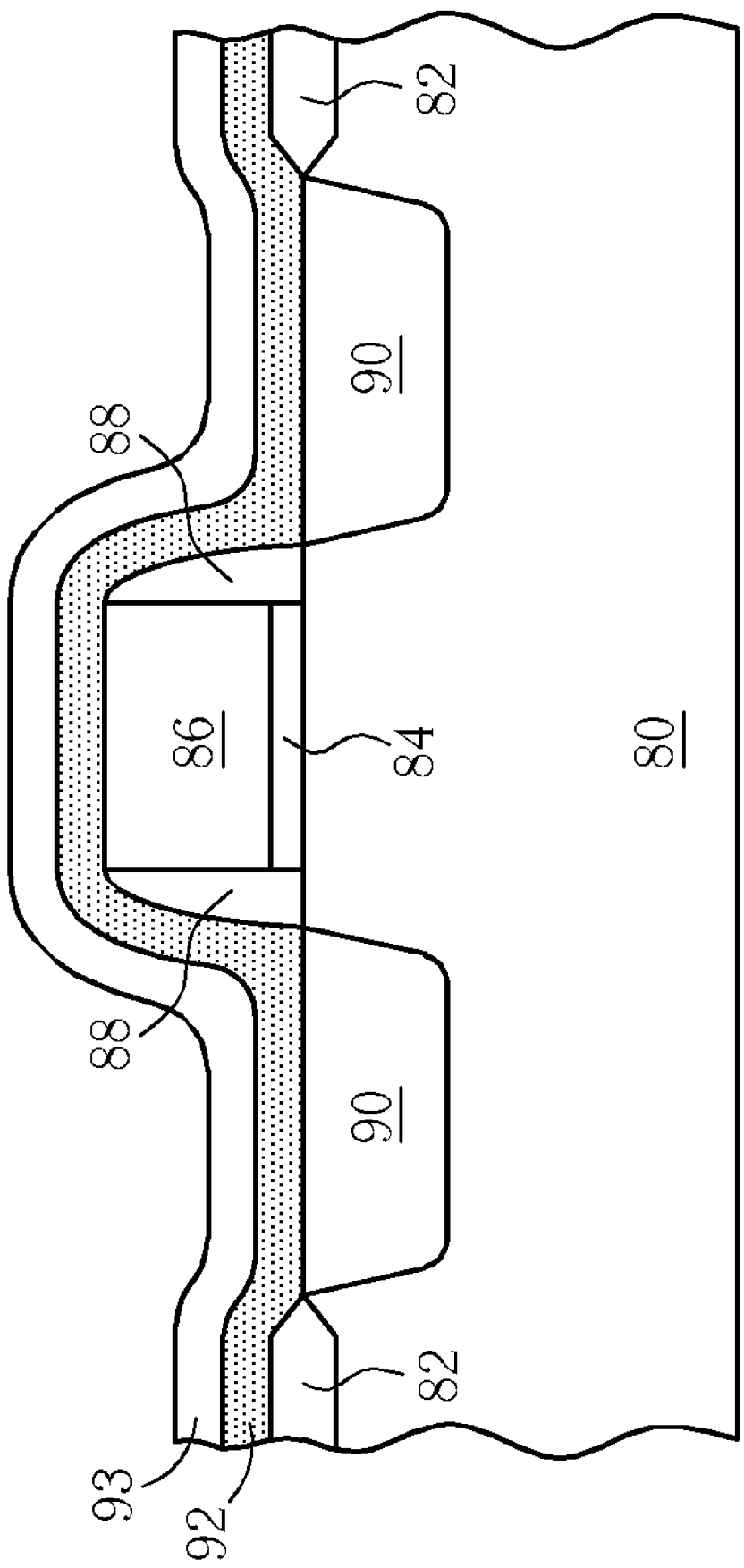
Figure 14:
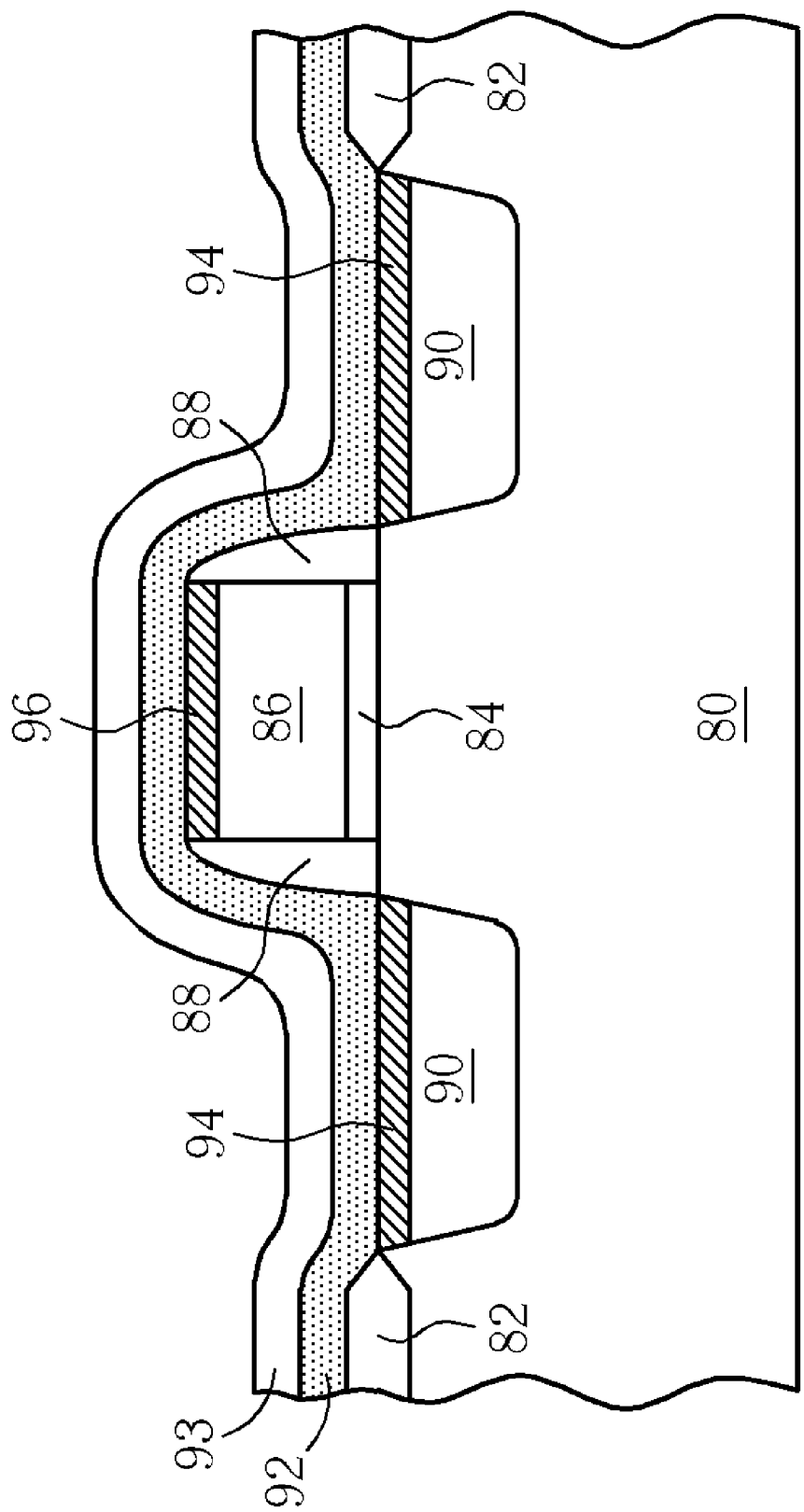

As shown in FIG. 13, a physical vapor deposition process, such as an evaporating process or a sputtering process, is performed to deposit a nickel layer 92 on the semiconductor substrate 80 to cover the gate 86 and the source/drain regions 90. The nickel layer 92 can be a nickel metal layer or a nickel alloy layer. After the nickel layer 92 is deposited, a barrier layer 93 e.g. a titanium layer or a titanium oxide layer is optionally formed on the nickel layer 92 to prevent oxidization of the nickel layer 92. As shown in FIG. 14, a first rapid thermal process is performed to react the nickel layer 92 with the source/drain regions 90 and the gate 86. Therefore, nickel monosilicide regions 94 substantially consist of nickel monosilicide are formed on the surface of the source/drain regions 90, and nickel silicide 96 is formed on the gate 86.

Figure 15:
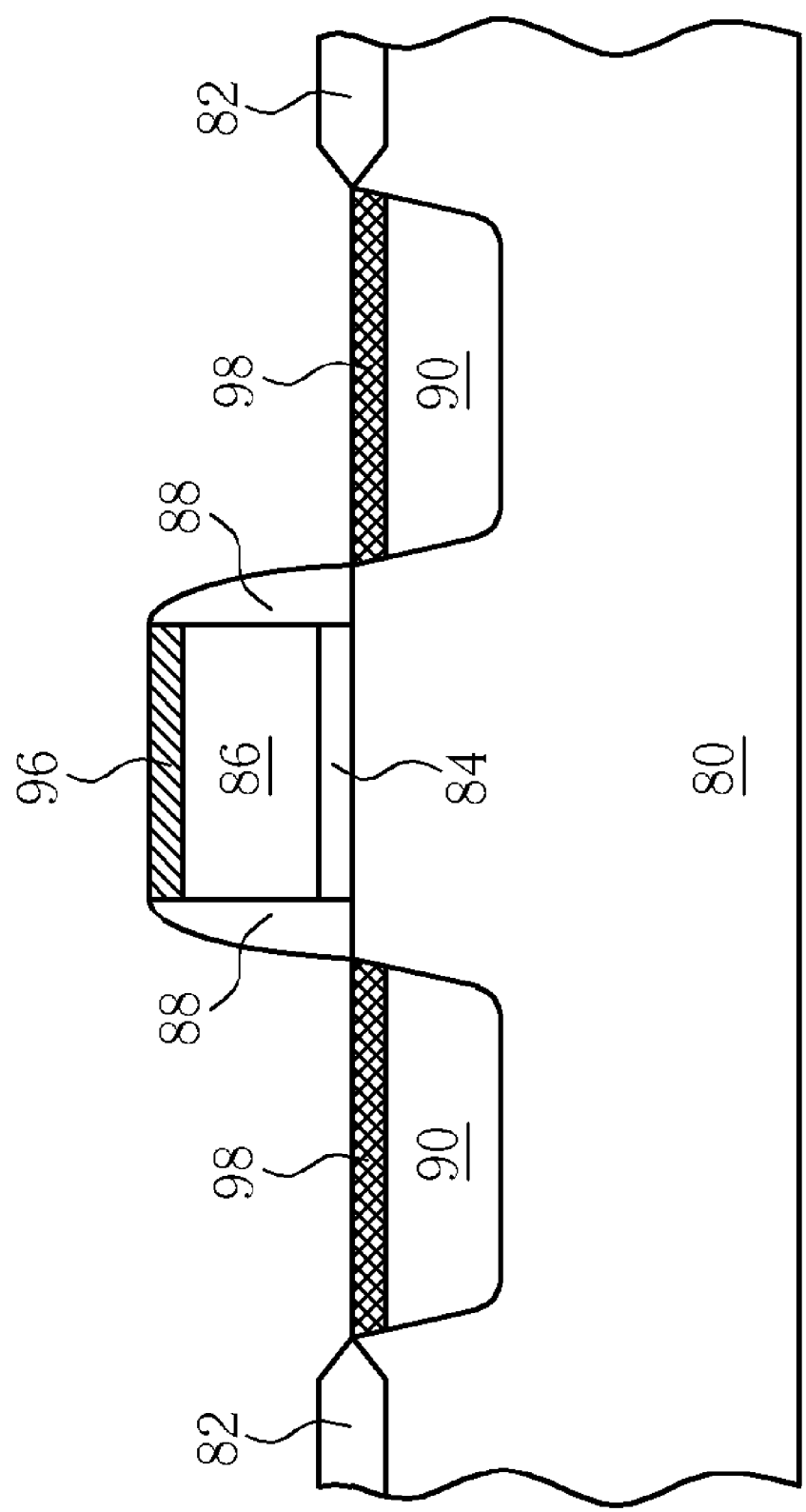

As shown in FIG. 15, the barrier layer 93 and the unreacted nickel layer 92 are removed. A second rapid thermal process is subsequently performed to transform a portion of nickel monosilicide in the nickel monosilicide regions 94 into nickel disilicide, so as to form nickel silicide regions 98 including nickel monosilicide and nickel disilicide. In this embodiment, the second rapid thermal process is a spike anneal process, and the weight percentage of nickel disilicide is between 1% and 10%. In comparison with the above embodiment, nickel monosilicide and nickel disilicide are uniformly dispersed instead of having an obvious interface therebetween by modifications of process parameters.

In conclusion, the method of the present invention partially transforms nickel monosilicide into nickel disilicide. This small amount of thermally stable nickel disilicide prevents nickel monosilicide from growing downward and laterally. Consequently, spiking defect and piping defect are prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device having nickel silicide, comprising:
   a semiconductor substrate;
   a plurality of doped regions disposed in the semiconductor substrate; and
   a plurality of nickel silicides disposed in the doped regions, each nickel silicide comprising a nickel monosilicide region comprising nickel monosilicide disposed on a surface of each doped region, and a nickel disilicide pocket comprising nickel disilicide, wherein the nickel disilicide pocket is uniform, disposed on an interface between each nickel monosilicide region and each doped region.

2. The semiconductor device having nickel silicide of claim 1, wherein nickel disilicide has a weight percentage of between 1% and 10%.

3. The semiconductor device having nickel silicide of claim 1, wherein the doped regions comprise source/drain regions.

4. The semiconductor device having nickel silicide of claim 1, further comprising a plurality of gates disposed on the semiconductor substrate.

5. A semiconductor device having nickel silicide, comprising:
   a semiconductor substrate;
   a plurality of doped regions disposed in the semiconductor substrate; and
   a plurality of nickel silicide regions disposed in the doped regions, each nickel silicide region comprising nickel disilicide wherein the nickel silicide region is uniformly dispersed, and nickel disilicide has a weight percentage of between 1% and 10%.

6. The semiconductor device having nickel silicide of claim 5, wherein the doped regions comprise source/drain regions.

7. The semiconductor device having nickel silicide of claim 5, further comprising a plurality of gates disposed on the semiconductor substrate.

* * * * *